(12) United States Patent
Hu et al.

(10) Patent No.: US 8,664,122 B2
(45) Date of Patent: Mar. 4, 2014

(54) METHOD OF FABRICATING A SEMICONDUCTOR DEVICE

(75) Inventors: Minda Hu, Beijing (CN); Dongjiang Wang, Beijing (CN); Haiyang Zhang, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 115 days.

(21) Appl. No.: 13/310,365

(22) Filed: Dec. 2, 2011

(65) Prior Publication Data

US 2013/0034960 A1 Feb. 7, 2013

(30) Foreign Application Priority Data

Aug. 3, 2011 (CN) .......................... 2011 1 0220347

(51) Int. Cl.
*H01L 21/302* (2006.01)
*H01L 21/461* (2006.01)

(52) U.S. Cl.
USPC ........... 438/706; 438/707; 438/710; 438/711; 438/712; 438/713; 438/714; 438/725

(58) Field of Classification Search
None
See application file for complete search history.

(56) References Cited

U.S. PATENT DOCUMENTS

| 6,746,973 | B1* | 6/2004 | Labelle et al. | 438/694 |
| 6,811,956 | B1* | 11/2004 | Gabriel | 430/313 |
| 2010/0015809 | A1* | 1/2010 | Adams et al. | 438/711 |
| 2011/0117749 | A1* | 5/2011 | Sheu et al. | 438/735 |

OTHER PUBLICATIONS

"Plasma-surface interactions of advanced photoresists with $C_4F_6$/Ar discharges: Plasma parameter dependencies", by S. Engelmann, et al, Journal of Vacuum Society & Technology B:2009, pp. 92-106.
"In-Situ Predictive Endpoint for Dual Damascene Trench Etch Depth Control for Composite Dielectric Films", by Rakesh Jaiswal, et al, IEEE Jun. 3, 2003, pp. 370-373.
"A Comprehensive LER-Aware TDDB Lifetime Model for Advanced Cu Interconnects", by Michele Stucchi, et al, IEEE Transactions on Device and Materials Reliability, vol. 11. No. 2, Jun. 2011, pp. 278-289.

* cited by examiner

*Primary Examiner* — Duy Deo
(74) *Attorney, Agent, or Firm* — Koppel, Patrick, Heybl & Philpott; Michael J. Ram

(57) ABSTRACT

The present invention discloses a method of fabricating a semiconductor device. In the present invention, after the formation of a photo-resist mask on a substrate, the photo-resist is subjected to a plasma pre-treatment, and then etch is conducted. With the plasma pre-treatment, a line width roughness of a linear pattern of the photo-resist can be improved, and thus much better linear patterns can be formed on the substrate during the subsequent etching steps.

22 Claims, 7 Drawing Sheets

US 8,664,122 B2

METHOD OF FABRICATING A SEMICONDUCTOR DEVICE

CROSS-REFERENCE TO RELATED APPLICATIONS

This application claims priority to Chinese Patent Application No. 201110220347.3, filed on Aug. 3, 2011 and entitled "Method of Fabricating a Semiconductor Device", which is incorporated herein in its entirety by reference.

BACKGROUND OF THE INVENTION

1. Field of the Invention

The present invention relates to a method of fabricating a semiconductor device, and more specifically, relates to a method of fabricating a semiconductor device which is capable of forming linear patterns on a substrate.

2. Description of the Related Art

With the continuous development of semiconductor techniques as well as the increasing shrinkage of critical dimensions, a hard mask technology taking, for example, a titanium nitride TiN as a representation, has become a mainstream in back-end-of-line (BEOL) fabrication. In the hard mask technology, in order to form a patterned hard mask on a substrate, the following processing as shown in FIGS. 1A-1E are usually adopted:

(1) depositing a TiN layer 102 on a substrate 101;
(2) depositing a bottom anti-reflective coating (Barc) (not shown) on the TiN layer;
(3) coating a photo-resist layer on the Barc;
(4) performing exposure and development for the photo-resist layer, forming a patterned photo-resist layer 103, thereby exposing a portion of the Barc, as shown in FIG. 1A;
(5) conducting a reactive ion etching on the exposed Barc using a mixed gas of $Cl_2$ and $O_2$, to remove this portion of the Barc, thereby exposing the underlying TiN;
(6) conducting a reactive ion etching on the exposed TiN using a mixed gas of $CH_4$ and $Cl_2$, to remove this portion of TiN;
(7) removing the photo-resist on the substrate, thereby forming a patterned TiN layer 104 on the substrate, as shown in FIG. 1B.

Next, on the basis of the patterned hard mask, steps of coating a photo-resist layer, performing exposure and development and forming a patterned photo-resist layer 105 are performed once again, as shown in FIG. 1C.

Next, a desired trench is formed on the substrate by a two-step etch.

The first-step etch takes the patterned photo-resist shown in FIG. 1C as a mask to conduct an etch on the substrate, thus forming a via 106. The photo-resist layer is then removed (as shown in FIG. 1D). And next, the substrate is etched continuously by taking the patterned hard mask as a mask, and finally a desired trench 107 is formed on the substrate (as shown in FIG. 1E).

Meanwhile, because of the shrinkage of critical dimensions, the influence of the line width roughness (LWR) of the photo-resist layer on the time dependent dielectric breakdown (TDDB) related performance becomes greater and greater.

As shown in FIG. 2, the line width roughness of the photo-resist includes a low-frequency line width roughness (L-LWR) 202 and a high-frequency line width roughness (H-LWR) 201. In the prior art, a method is proposed in which the patterned photo-resist is pre-treated through $CHF_3$ before etching, so as to improve the high-frequency line width roughness of the photo-resist. Engelmann has also proposed a method of conducting a plasma treatment on the photo-resist surface with $C_4F_8$/Ar (Engelmann. S "Plasma-surface interactions of advanced photo-resists with $C_4F_8$/Ar discharges", Journal of Vac Science & Technology B: 2009).

However, since fluorine-based gases may cause corrosion to hard masks such as titanium nitride, these treatment methods are not applicable in fabrications having hard masks.

Thus, there is a need for a new technology to address any problems mentioned above in the prior art.

SUMMARY OF THE INVENTION

An object of the present invention is to provide a method of fabricating a semiconductor device and thus to address at least one of the above problems in the prior art.

According to an aspect of the present invention, there is provided a method of forming linear patterns, which comprises: forming a patterned photo-resist layer on a substrate; performing plasma pre-treatment of the photo-resist layer, to reduce the line width roughness of the patterned photo-resist layer; and conducting an etch on the substrate to form a patterned substrate.

According to another aspect of the present invention, there is provided a method of fabricating a semiconductor device, which comprises: forming a patterned photo-resist layer on a substrate, performing plasma pre-treatment for the photo-resist layer, to reduce a line width roughness of the patterned photo-resist layer, and conducting an etch on the substrate to form a patterned substrate.

Preferably, the step of plasma pre-treatment includes: a first pre-treatment, for performing a plasma treatment for the photo-resist layer using a mixed gas of HBr and an inert gas or using a mixed gas of $CH_4$ and an inert gas.

During the First Pre-treatment:

Preferably, the pressure for the first pre-treatment is 5-15 mTorr, and more preferably, the pressure for the first pre-treatment is 5-10 mTorr.

Preferably, the time for the first pre-treatment is 5-15 s, and more preferably, the time for the first pre-treatment is 5-9 s.

Preferably, when the inert gas is helium gas (He), a partial pressure ratio of the HBr and the He is from 3:1 to 5:1; when the inert gas is argon gas (Ar), a partial pressure ratio of the HBr and the Ar is from 5:1 to 10:1.

Preferably, when the inert gas is helium gas (He), a partial pressure ratio of the $CH_4$ and the He is from 2:1 to 3:1; when the inert gas is argon gas (Ar), a partial pressure ratio of the $CH_4$ and the Ar is from 1:1 to 2:1.

Preferably, during the first pre-treatment, the mixed gas is ionized in a reaction chamber by a radio-frequency generator to generate plasmas. The radio-frequency generator has a radio-frequency power preferably ranging from 300 W to 900 W, and a frequency preferably ranging from 10 MHz to 60 MHz.

In addition, preferably, the step of plasma pre-treatment further includes: a second pre-treatment, for performing plasma treatment for the photo-resist layer using a mixed gas of inert gas and $CH_4$.

During the Second Pre-Treatment:

Preferably, when the inert gas is argon gas (Ar), a partial pressure ratio of the Ar and the $CH_4$ is from 3:1 to 8:1; and more preferably, when the inert gas is argon gas (Ar), a partial pressure ratio of the Ar and the $CH_4$ is from 4:1 to 5:1.

Preferably, when the inert gas is helium gas (He), a partial pressure ratio of the He and the $CH_4$ is from 4:1 to 10:1; and more preferably, when the inert gas is helium gas (He), a partial pressure ratio of the He and the $CH_4$ is from 4:1 to 6:1.

Preferably, the pressure for the second pre-treatment is 5-15 mTorr, and more preferably, the pressure for the second pre-treatment is 8-12 mTorr.

Preferably, the temperature for the second pre-treatment is 35-55° C.; and more preferably, the temperature for the second pre-treatment is 48-52° C.

Preferably, the time for the second pre-treatment is 5-15 s, and more preferably, the time for the second pre-treatment is 8-10 s.

Preferably, during the second pre-treatment, the mixed gas is ionized in a reaction chamber by a radio-frequency generator, and thus plasmas are generated. The radio-frequency generator has a radio-frequency power preferably ranging from 300 W to 900 W, and a frequency preferably ranging from 10 MHz to 60 MHz.

In the present invention, the substrate can be, for example, a substrate covered with a hard mask (e.g. TiN), and the photo-resist layer can be, for example, a single-layer photo-resist or a tri-layer photo-resist. For example, the tri-layer photo-resist can include, for example, a low-temperature oxide (LTO) layer, a Si bottom anti-reflective coating and an amorphous carbon layer.

The advantages of the present invention include at least one of the following: before conducting an etch on the substrate, performing plasma pre-treatment for the photo-resist mask that is formed on the substrate, improving low-frequency and/or high-frequency line width roughness of the linear patterns of the photo-resist. Using the photo-resist mask that has been subjected to the plasma pre-treatment conducting an etch on the substrate to obtain, on the substrate, a pattern (e.g. a trench) with a smaller line width roughness, thereby increasing semiconductor device yields and improving semiconductor device performance parameters, such that a semiconductor device can be obtained with smaller critical dimensions (CD).

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the accompanying drawings, the present invention can be more clearly understood based on the following detailed description, wherein.

DESCRIPTION OF THE EMBODIMENTS

Figure 1A:
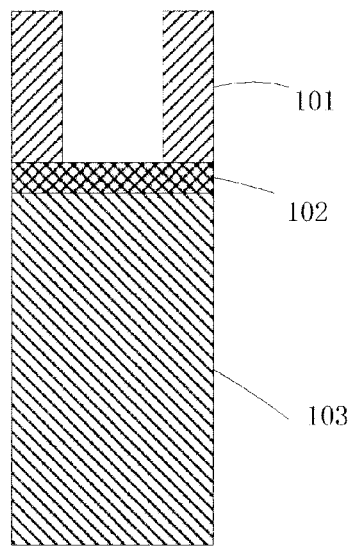
FIGS. 1A-1E are diagrams showing the prior art formation of a trench on a substrate using a hard mask.
Figure 1B:
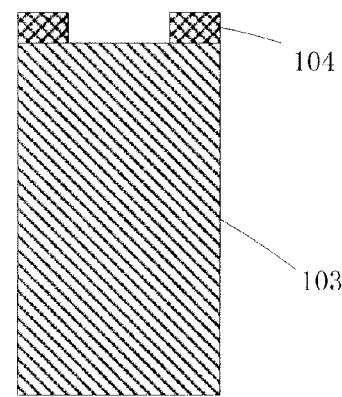
Figure 1C:
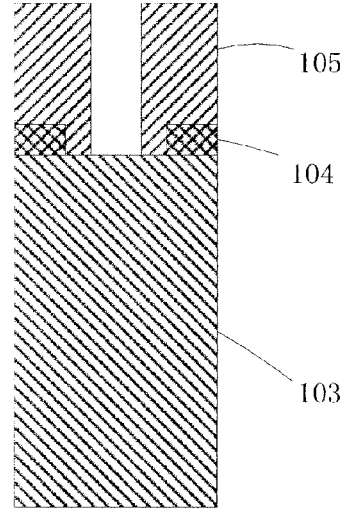
Figure 1D:
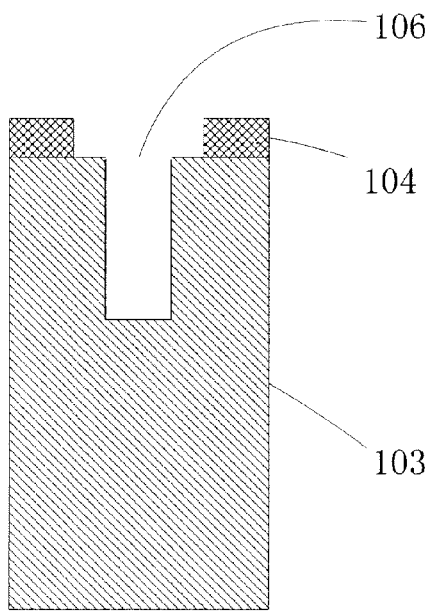
Figure 1E:
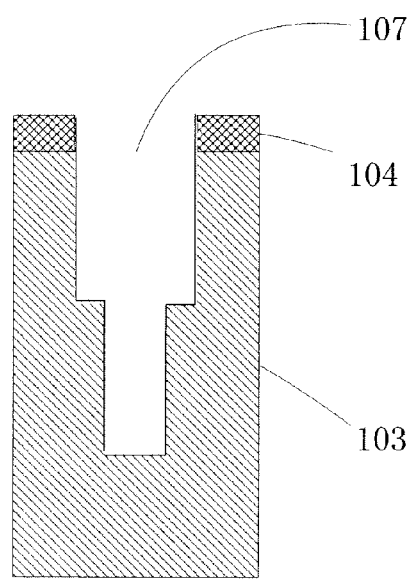
Figure 2:
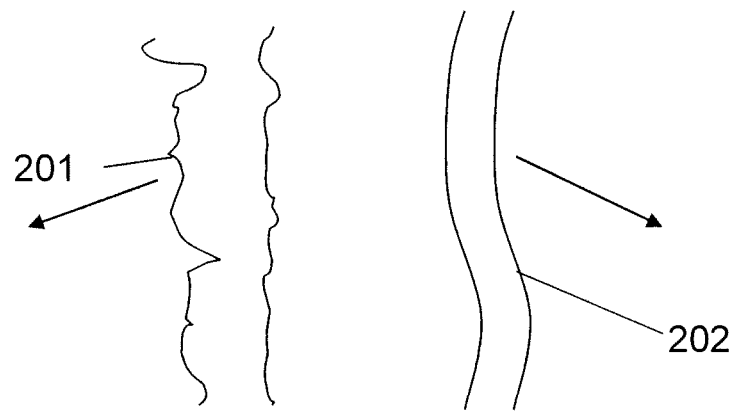
FIG. 2 illustrates a high-frequency line width roughness and a low-frequency line width roughness of a photo-resist.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one skilled in the art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 3:
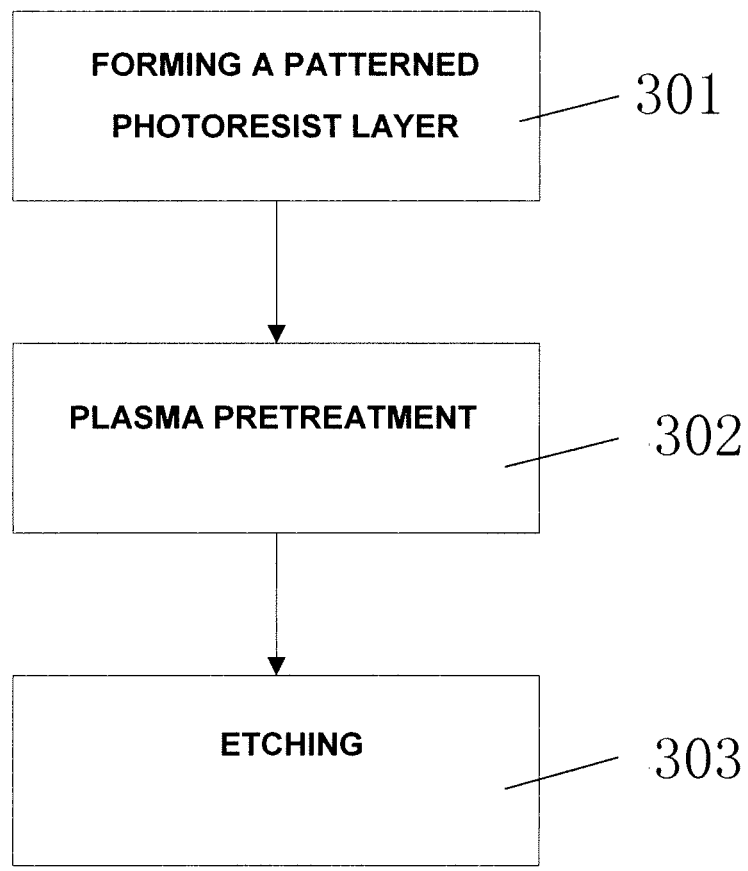
FIG. 3 is a flowchart showing a method of fabricating a semiconductor device according to an embodiment of the present invention.

FIG. 3 is a flowchart showing a method of fabricating a semiconductor device according to one embodiment of the present invention.

As shown in FIG. 3, in the method of fabricating a semiconductor device according to the present invention, a linear pattern is formed through the following steps.

Firstly, a patterned photo-resist layer is formed on a substrate (Step 301). That is to say, a photo-resist is coated on the substrate, and after exposure and development, a patterned photo-resist layer is formed.

Herein, the substrate can be any type of substrates with various structures, for example, a semiconductor substrate, a semiconductor substrate covered with a hard mask (e.g. TiN), etc. Various types and structures of photo-resists can be selected as the photo-resist, for example, a single-layer photo-resist or a tri-layer photo-resist (which, for example, includes a low-temperature oxide (LTO) layer, a Si bottom anti-reflective coating and an amorphous carbon layer).

Figure 4:
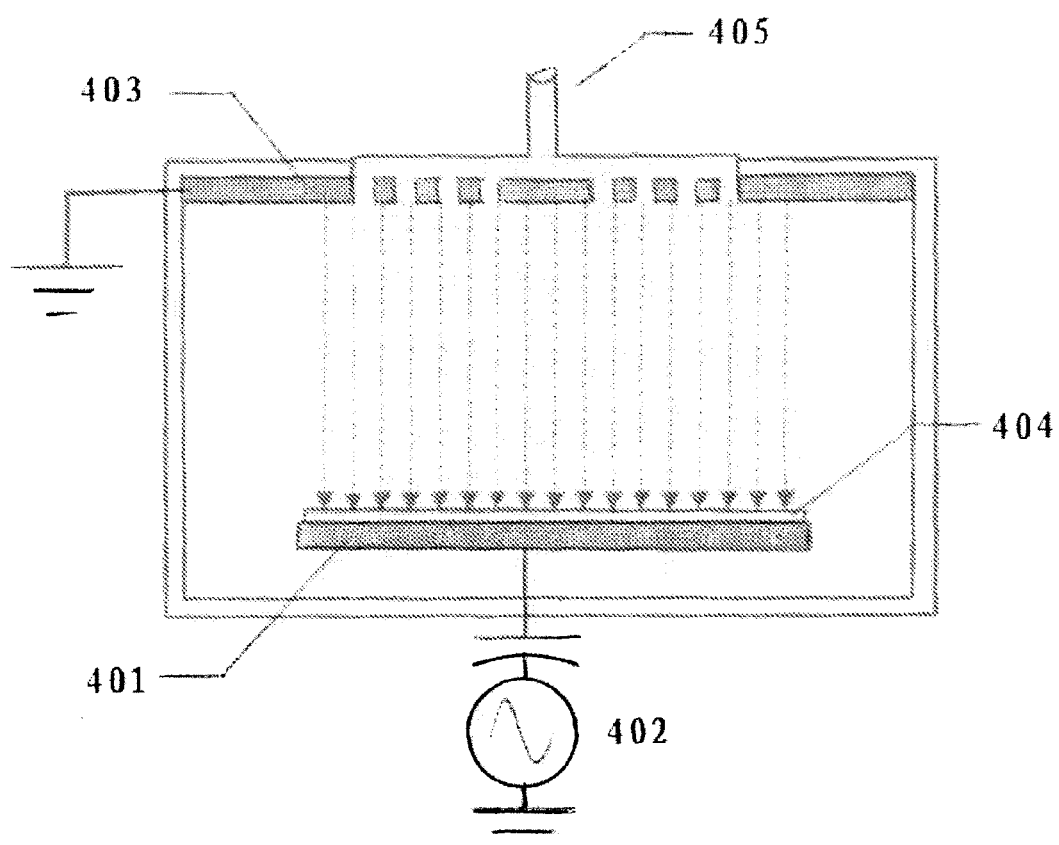
FIG. 4 is a diagram showing an exemplary plasma etching reactor.

Then, plasma pre-treatment is performed on the photo-resist layer (Step 302). Specifically speaking, the substrate that has a patterned photo-resist layer formed thereon is placed into a plasma etching machine. The photo-resist layer is subjected to plasma pre-treatment, thus improving (reducing) the line width roughness of the linear pattern in the photo-resist pattern. FIG. 4 shows an exemplary plasma etching reactor. As shown in FIG. 4, the plasma etching reactor can be a parallel-plate reactive ion etching (RIE) reactor, which includes an inlet 405, a grounding electroplate (anode) 403, a power electrode (cathode) 401, and a radio-frequency (RF) generator 402.

When performing plasma pre-treatment on the photo-resist, the substrate 404 is placed on the cathode 401. Gases enter into the reaction chamber through the inlet 405. Under a certain pressure and temperature, a pre-determined radio-frequency voltage and radio-frequency power is applied to the cathode 401 by the radio-frequency (RF) generator 402, such that glow discharge is produced between the anode 403 and the cathode 401. Gases within the reaction chamber are ionized to generate plasmas. The energized particles (positive ions for the bombardment) of the plasma accelerate towards the substrate surface under a strong electric field so as to react with the photo-resist on the substrate, thereby improving (reducing) the line width roughness of the linear pattern of the photo-resist.

The above is merely a simple explanation of an exemplary structure of the plasma etching reactor. However, based on the description of the present invention, one of ordinary skill in the art can clearly know that, various types of plasma etching reactors can be employed to perform plasma pre-treatment for the photo-resist on the substrate, and the present invention is not limited to the example shown in FIG. 4.

Finally, by taking the photo-resist that has been subjected to the above plasma pre-treatment as a mask, etch is conducted on the substrate to form a patterned substrate (Step 303). After the above plasma pre-treatment, the line width roughness of the linear pattern of the photo-resist can be improved, and thus the line width roughness of the linear pattern obtained on the substrate after etching can also be improved.

Next, the present invention is further described in detail in conjunction with more embodiments.

Figure 5:
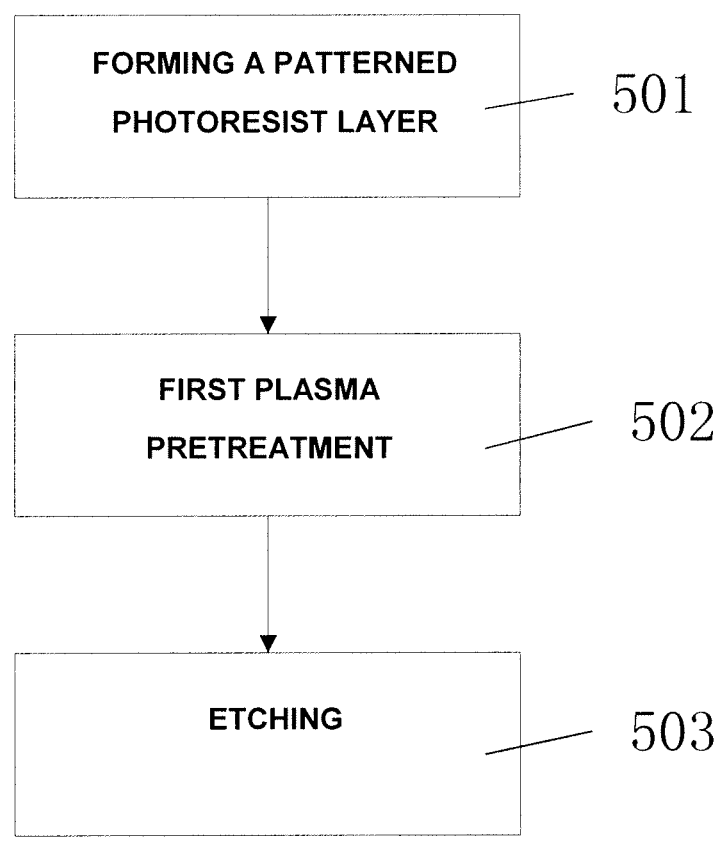
FIG. 5 is a flowchart showing a method of fabricating a semiconductor device according to one embodiment of the present invention.

FIG. 5 is a flowchart showing steps for forming linear patterns in a method of fabricating a semiconductor device according to one embodiment of the present invention. Steps 501 and 503 of FIG. 5 are similar to steps 301 and 303 of FIG. 3, and thus related description thereof will be omitted.

Step 502 corresponds to step 302 of FIG. 3. That is to say, pre-treatment for the photo-resist layer is conducted using a first plasma pre-treatment (i.e. a first pre-treatment), so as to improve the low-frequency line width roughness (L-LWR) 202 of the linear pattern of the photo-resist. This first pre-treatment aims at forming an organic film on the photo-resist through the reaction between the gases within the reaction chamber and the photo-resist. However, it should be noted that, if the reaction consumes excessive photo-resist, the width and height of the linear pattern may consequently be changed. Thus, it is more preferable if the reaction between the gases and the photo-resist does not substantially consume the photo-resist.

According to the above description, in one example, a mixed gas of HBr and inert gas or a mixed gas of $CH_4$ and inert gas can be employed in the reaction chamber.

The inert gas can be, for example, He, Ar, or the like.

The pressure for the mixed gas within the reaction chamber is preferably controlled within 5-15 mTorr, and more preferably, within 5-10 mTorr.

When using a mixed gas of HBr and He, a partial pressure ratio of the HBr and the He is preferably, for example, from 3:1 to 5:1; when using a mixed gas of HBr and Ar, a partial pressure ratio of the HBr and the Ar is preferably, for example, from 5:1 to 10:1.

When using a mixed gas of $CH_4$ and He, a partial pressure ratio of the $CH_4$ and the He is preferably, for example, from 2:1 to 3:1; when using a mixed gas of $CH_4$ and Ar, a partial pressure ratio of the $CH_4$ and the Ar is preferably, for example, from 1:1 to 2:1.

Generally, during the first pre-treatment, the temperature within the reaction chamber is kept, for example, at 35-55° C., and the reaction time can be controlled to be, for example, 5-15 s, and more preferably, 5-9 s.

In this embodiment, the radio-frequency (RF) generator in the reaction chamber has a radio-frequency power preferably ranging from 300 W to 900 W, and a frequency preferably ranging from 10 MHz to 60 MHz.

Of course, it should be appreciated that, the aforementioned parameters such as gas composition, specific pressure, partial pressure ratio, temperature, time, power and frequency are merely illustrative. Based on the hints of the present invention, one of ordinary skill in the art can select appropriate parameters according to actual needs.

After the above first pre-treatment, the low-frequency line width roughness (L-LWR) 202 of the linear pattern can be scaled down from more than ten nm to about 5 nm~7 nm.

Figure 6:
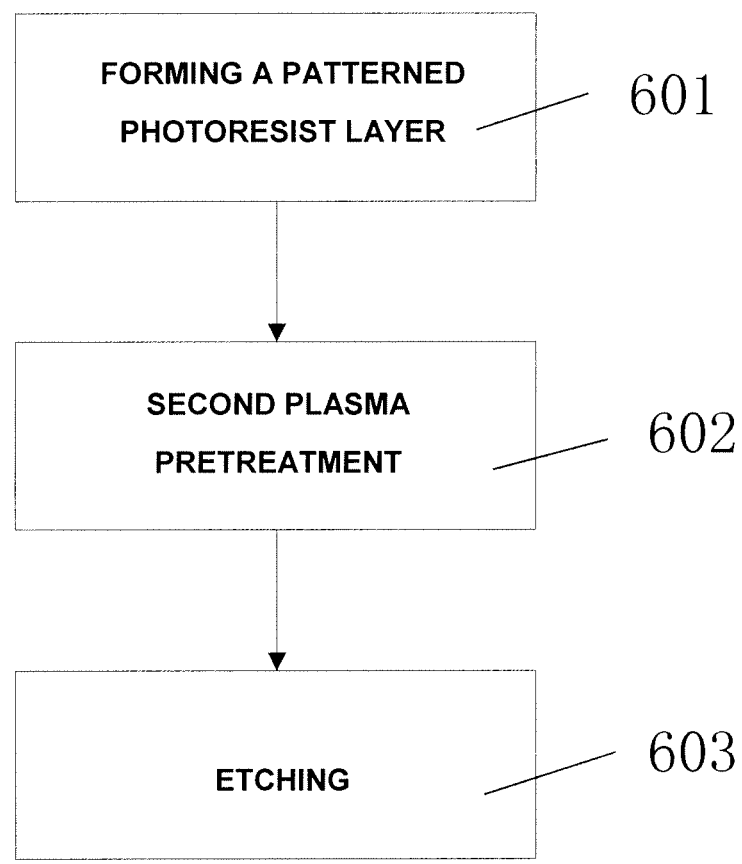
FIG. 6 is a flowchart showing a method of fabricating a semiconductor device according to another embodiment of the present invention.

FIG. 6 is a flowchart showing a method of fabricating a semiconductor device according to another embodiment of the present invention. Steps 601 and 603 of FIG. 6 are similar to steps 301 and 303 of FIG. 3, and related description thereof will be omitted.

Step 602 corresponds to step 302 of FIG. 3. That is to say, pre-treatment for the photo-resist layer is conducted using a second plasma pre-treatment (i.e. a second pre-treatment), thereby improving the high-frequency line width roughness (H-LWR) 201 of the linear pattern of the photo-resist. The second pre-treatment aims at improving the high-frequency line width roughness 201 of the linear pattern through the bombardments of the photo-resist from the plasmas within the reaction chamber. Generally, gases within the reaction chamber are preferably less active and with greater atomic weights.

According to the above description, in one example, a mixed gas of $CH_4$ and inert gas can be employed in the reaction chamber.

The inert gas can be, for example, He, Ar, or the like.

The pressure for the mixed gas within the reaction chamber can be preferably controlled within 5-15 mTorr, and more preferably, within 8-12 mTorr.

When using a mixed gas of $CH_4$ and He, a partial pressure ratio of the He and the $CH_4$ is preferably, for example, from 4:1 to 10:1, and more preferably, from 4:1 to 6:1.

When using a mixed gas of $CH_4$ and Ar, a partial pressure ratio of the Ar and the $CH_4$ is preferably, for example, from 3:1 to 8:1, and more preferably, from 4:1 to 5:1.

Generally, during the second pre-treatment, the temperature within the reaction chamber is kept, for example, at 35-55° C., and more preferably, at 48-52° C.; And the reaction time can be controlled within, for example, 5-15 s, and more preferably, 8-10 s.

In this embodiment, the radio-frequency (RF) generator within the reaction chamber has a radio-frequency power preferably ranging from 300 W to 900 W, and a frequency preferably ranging from 10 MHz to 60 MHz.

Of course, it should be appreciated that, the aforementioned parameters like gas composition, specific pressure, partial pressure ratio, temperature, time, power and frequency are merely illustrative. Based on the hints of the present invention, one of ordinary skill in the art can select appropriate parameters according to actual needs.

After the above second pre-treatment, the high-frequency line width roughness (H-LWR) 201 of the linear pattern can be scaled down from more than ten nm to about 5 nm ~7 nm.

Figure 7:
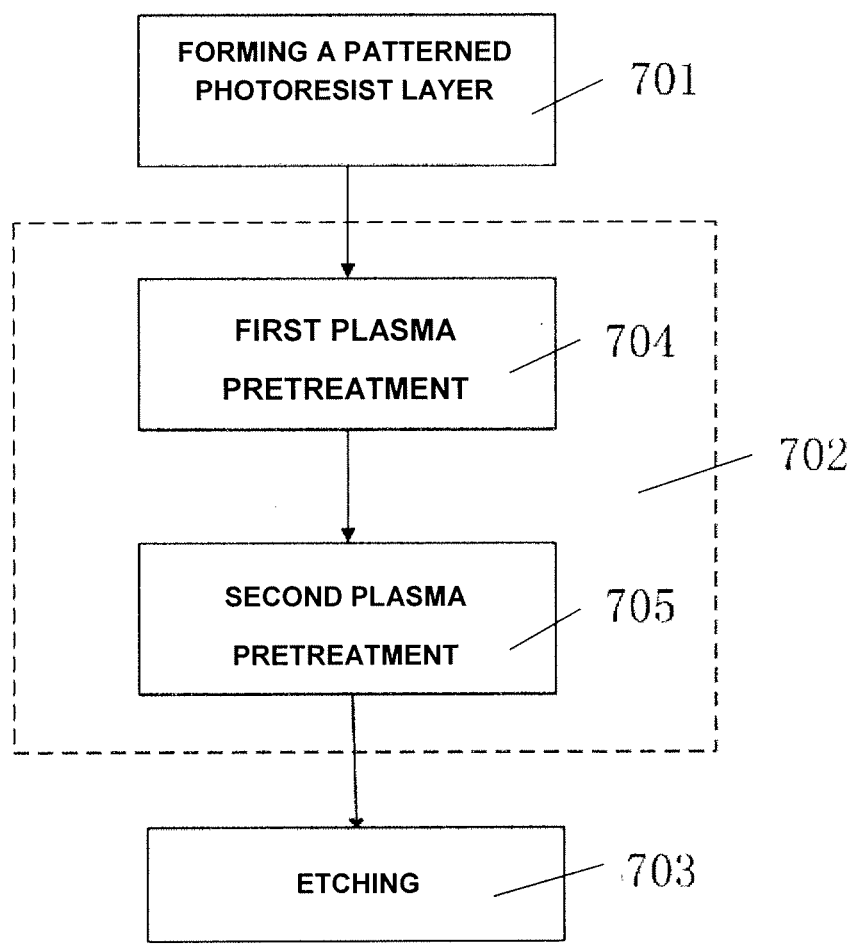
FIG. 7 is a flowchart showing a method of fabricating a semiconductor device according to a further embodiment of the present invention.

FIG. 7 is a flowchart showing a method of fabricating a semiconductor device according to a further embodiment of the present invention. Steps 701 and 703 of FIG. 7 are similar to steps 301 and 303 of FIG. 3, and related description thereof will be omitted.

In FIG. 7, the plasma pre-treatment step 702 for the photo-resist includes two steps, i.e. a first plasma pre-treatment step 704 and a second plasma pre-treatment step 705. Step 704 is similar to step 502 of FIG. 5, and step 705 is similar to step 602 of FIG. 6. For the sake of brevity, detailed description thereof will not be repeated.

In the embodiment illustrated in FIG. 7, performing the first plasma pre-treatment step 704 and the second plasma pre-treatment step 705 successively for the patterned photo-resist can improve (reduce) both the low-frequency line width roughness 202 and the high-frequency line width roughness 201 of the linear pattern of the photo-resist, thus being able to obtain a better photo-resist pattern.

Figure 8:
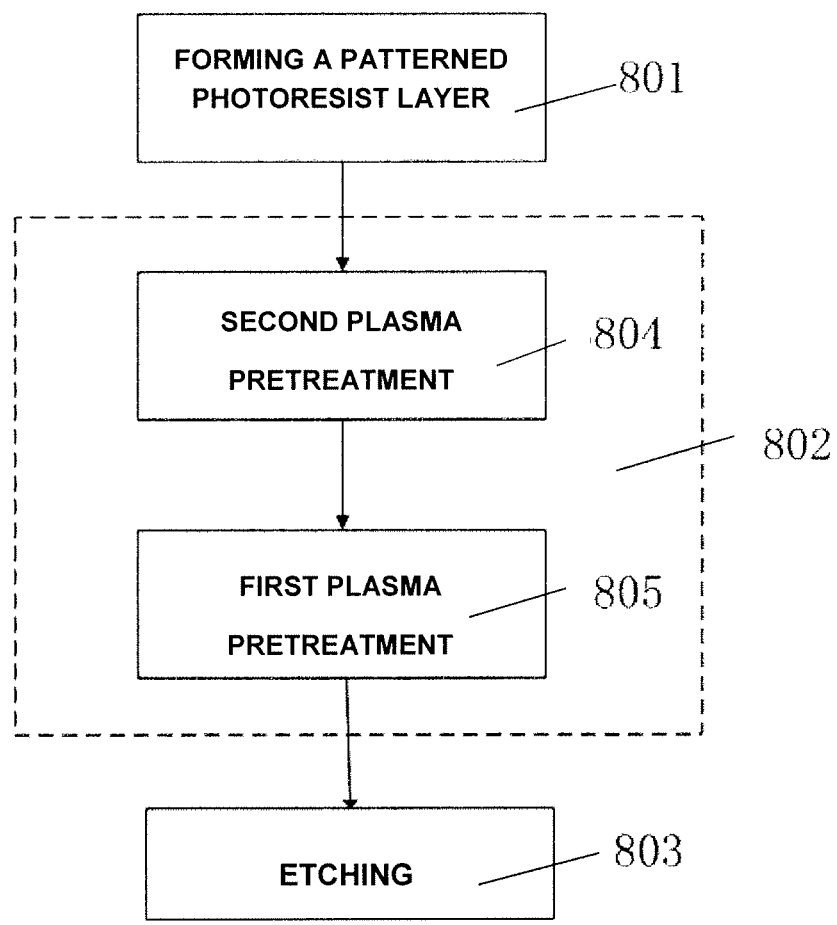
FIG. 8 is a flowchart showing a method of fabricating a semiconductor device according to a still further embodiment of the present invention.

Of course, one of ordinary skill in the art should appreciate that, the order of the first plasma pre-treatment and the second plasma pre-treatment is not limited to that shown in FIG. 7. FIG. 8 presents another flowchart for a method of fabricating a semiconductor device according to a still further embodiment of the present invention. Steps 801 and 803 of FIG. 8 are similar to steps 301 and 303 of FIG. 3, and thus related description thereof will be omitted.

In FIG. 8, the plasma pre-treatment step 802 for the linear pattern of the photo-resist likewise includes a second plasma pre-treatment step 804 and a first plasma pre-treatment step 805. The embodiment of FIG. 8 differs from the embodiment of FIG. 7 in that, the linear pattern of the photo-resist is firstly subjected to the second plasma pre-treatment step 804 and then to the first plasma pre-treatment step 805. After the processing of step 802 in FIG. 8, the high-frequency line width roughness 201 and the low-frequency line width roughness 202 of the linear pattern of the photo-resist can also be improved.

In the methods shown in FIG. 7 and FIG. 8, the first pre-treatment and the second pre-treatment are combined together, and thus both the low-frequency line width roughness 202 and the high-frequency line width roughness 201 can be improved. After the linear pattern has been subjected to the first pre-treatment and the second pre-treatment, its line width roughness (LWR) can reach to about 4 nm.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

The invention claimed is:

1. A method of fabricating a semiconductor device, comprising:
    forming a patterned photo-resist layer on a substrate,
    performing a plasma pre-treatment on said photo-resist layer, to reduce the line width roughness of the patterned photo-resist layer, and
    conducting an etch on the substrate to form a patterned substrate;
    wherein the plasma pre-treatment on said photo-resist layer is a two-step process a mixed gas of CH4 and an inert gas, the partial pressure ratio of the inert gas to the CH4 in the second step being greater than in said first step, and
    in the first step, the partial pressure of said CH4 is larger than or equal to the partial pressure of said inert gas.

2. The method according to claim 1, wherein the pressure for said first pre-treatment is 5-15 mTorr.

3. The method according to claim 1, wherein the pressure for said first pre-treatment is 5-10 mTorr.

4. The method according to claim 1, wherein the temperature for said first pre-treatment is 35-55° C.

5. The method according to claim 1, wherein the time for said first pre-treatment is 5-15 s.

6. The method according to claim 1, wherein the time for said first pre-treatment is 5-9 s.

7. The method according to claim 1, wherein said inert gas is helium gas (He), a partial pressure ratio of said $CH_4$ and said He is 2:1 to 3:1.

8. The method according to claim 1, wherein said inert gas is argon gas (Ar), a partial pressure ratio of said $CH_4$ and said Ar is 1:1 to 2:1.

9. The method according to claim 1, wherein plasmas are generated by a radio-frequency (RF) generator during said first pre-treatment, said radio-frequency generator has a radio-frequency power of 300 W~900 W and a frequency of 10 MHz~60 MHz.

10. The method according to claim 1, wherein said inert gas is argon gas (Ar), the partial pressure ratio of said Ar and said CH4 is 3:1 to 8:1 in the second step.

11. The method according to claim 1, wherein said inert gas is argon gas (Ar), the partial pressure ratio of said Ar and said CH4 is 4:1 to 5:1 in the second step.

12. The method according to claim 1, wherein said inert gas is helium gas (He), and the partial pressure ratio of said He and said CH4 is 4:1 to 10:1 in the second step.

13. The method according to claim 1, wherein said inert gas is helium gas (He), and the partial pressure ratio of said He and said CH4 is 4:1 to 6:1 in the second step.

14. The method according to claim 1, wherein the pressure for said second step is 5-15 mTorr.

15. The method according to claim 1, wherein the pressure for said second step is 8-12 mTorr.

16. The method according to claim 1, wherein the temperature for said second step is 35-55° C.

17. The method according to claim 1, wherein the temperature for said second step is 48-52° C.

18. The method according to claim 1, wherein the time for said second step is 5-15 s.

19. The method according to claim 1, wherein the time for said second step is 8-10 s.

20. The method according to claim 1, wherein plasmas are generated by a radio-frequency generator in said second step, and said radio-frequency generator has a radio-frequency power of 300 W~900 W and a frequency of 10 MHz~60 MHz.

21. A method of fabricating a semiconductor device, comprising:
    forming a patterned photo-resist layer on a substrate,
    performing a first pre-treatment on said photo-resist layer using a mixed gas of CH4 and an inert gas, wherein, the partial pressure of said CH4 is larger than or equal to the partial pressure of said inert gas, and
    performing a second pre-treatment on said photo-resist layer using a mixed gas of an inert gas and CH4, wherein the partial pressure of said inert gas is larger than the partial pressure of said CH4, and
    conducting an etch on the substrate to form a patterned substrate.

22. A method of fabricating a semiconductor device, comprising:
    forming a patterned photo-resist layer on a substrate,
    performing a pre-treatment on said photo-resist layer using a mixed gas of inert gas and CH4, wherein the partial pressure of said CH4 is larger than or equal to the partial pressure of said inert gas, and
    performing a subsequent pre-treatment on said photo-resist layer using a mixed gas of CH4 and an inert gas, wherein, partial pressure of said inert gas is larger than the partial pressure of said CH4, and conducting an etch on the substrate to form a patterned substrate.

* * * * *

UNITED STATES PATENT AND TRADEMARK OFFICE
CERTIFICATE OF CORRECTION

| | | Page 1 of 1 |
|---|---|---|
| PATENT NO. | : 8,664,122 B2 | |
| APPLICATION NO. | : 13/310365 | |
| DATED | : March 4, 2014 | |
| INVENTOR(S) | : Minda Hu et al. | |

It is certified that error appears in the above-identified patent and that said Letters Patent is hereby corrected as shown below:

In the Claims:

Column 7, Claim 1, Line 54: after "layer is a two-step process" please add --using--

Signed and Sealed this
Twenty-fourth Day of June, 2014

Michelle K. Lee
*Deputy Director of the United States Patent and Trademark Office*